United States Patent [19]

Botti et al.

[11] Patent Number: 4,752,747
[45] Date of Patent: Jun. 21, 1988

[54] DEVICE FOR INCREASING THE OUTPUT POWER OF A LOW-TENSION OPERATED RADIO SET, PARTICULARLY OF THE CAR RADIO SET TYPE

[75] Inventors: Edoardo Botti, Mortara; Aldo Torazzina; Bruno Murari, both of Monza, all of Italy

[73] Assignee: SGS-Thomson Microelectronics S.p.A., Catania, Italy

[21] Appl. No.: 916,801

[22] Filed: Oct. 8, 1986

[30] Foreign Application Priority Data

Oct. 16, 1985 [IT] Italy ............................... 22502 A/85

[51] Int. Cl.$^4$ ............................................. H03F 1/02
[52] U.S. Cl. ..................................... 330/297; 330/127
[58] Field of Search ............... 330/127, 297, 207 P, 330/298, 285

[56] References Cited

U.S. PATENT DOCUMENTS 4,320,350  3/1982  Drapac ............................ 330/297

Primary Examiner—Gene Wan
Attorney, Agent, or Firm—Fitzpatrick, Cella, Harper & Scinto

[57] ABSTRACT

A device for increasing the power output of a low-tension operated amplifier which is connected to a standard impedance loudspeaker and is powered at a voltage level which, in the presence of an audio signal, consists of the DC operating voltage for the set and an overlapping variable voltage which is proportional to the audio signal input to the amplifier.

Thus, a high dynamic range is afforded for the output signal from the amplifier directed to the loudspeaker.

8 Claims, 12 Drawing Sheets

DEVICE FOR INCREASING THE OUTPUT POWER OF A LOW-TENSION OPERATED RADIO SET, PARTICULARLY OF THE CAR RADIO SET TYPE

FIELD OF THE INVENTION

This invention relates to a device for increasing the output power of a low-tension (low voltage) operated amplifier, e.g. of the type intended for installation on vehicles, in particular motor cars. The DC operating voltage for such sets is picked up from the battery, and is generally at 14.4 Volts.

DESCRIPTION OF THE PRIOR ART

As is known, there are two ways of increasing power: either to lower the load impedance—in this specific instance the impedance of the loudspeaker—or to elevate the so-called dynamic range of the signal on the load, that is to elevate the voltage being applied to the load.

The prior art has proposed solutions pertaining to either ways, but with significant attendant disadvantages. For instance, is has been proposed of using loudspeakers having a lower impedance than standard values, which are known to be either 4 or 8 Ohms. That solution, while being the more obvious one, involves use of non-standard loudspeakers, and hence, all those drawbacks which connect with the procurement and cost of such components.

It has also been proposed to lower the impedance as seen by the final amplifier, by coupling it to the load through a step-up transformer. Such a solution has, however, the disadvantage that it requires power transformers operating at audio frequencies. As for the second way of increasing power, i.e. elevating the dynamic range of the signal on the load, the prior art has proposed so-called "bridge" circuitries wherein two amplifiers, having at their respective outputs signals with the same amplitude and opposed phases, are connected to the load, or alternatively, so-called "step-up converters" wherein the load is powered through a circuit comprising a DC/AC voltage converter and a step-up transformer.

However, both solutions have serious disadvantages. In the former instance, the output power to be obtained is limited by the maximum dynamic range of the two amplifiers which, assuming saturation to be nil, is equal at most to twice the power supply voltage.

In the latter instance, given the presence of a DC/AC voltage converter, heavy shielding becomes necessary to avoid problems of irradiation radio bands.

The problem underlying this invention is to provide a device for increasing the output power of a low-tension (low voltage) operated amplifier, in particular of the car radio set type, which can accept standard components, particularly as relates to the loudspeaker impedance, without incurring the disadvantages exhibited by prior approaches and discussed hereinabove.

SUMMARY OF THE INVENTION

This problem is solved, in accordance with this invention, by a device, comprising at least a first amplifier with a signal input terminal to which the audio signal to be amplified is supplied, an output which can be connected to a loudspeaker, and an operating voltage input terminal to which operating voltages are applied. The operating voltage to said amplifier is picked up from a circuit node whereat the voltage, in the absence of an audio signal for amplification by said amplifier, does not exceed the set operating DC voltage. An operating voltage control circuit is also provided which is constructed and connected to superimpose on the operating voltage applied to the operating voltage input terminal a voltage proportional to the input audio signal.

BRIEF DESCRIPTION OF THE DRAWINGS

The invention will be now further described in connection with some preferred embodiments thereof as shown by way of example in the accompanying drawings, where.

DETAILED DESCRIPTION OF THE PREFERRED EMBODIMENTS

Figure 1:
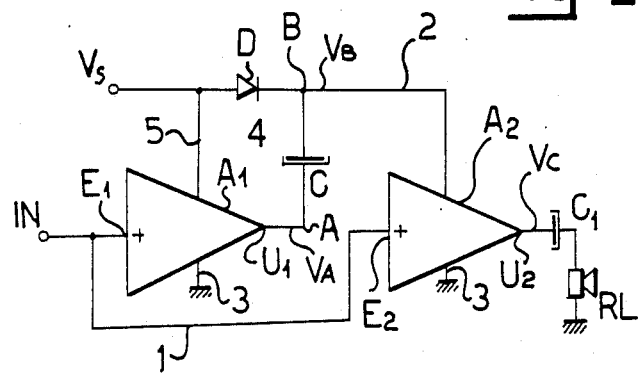
FIG. 1 shows a circuit diagram of a device according to a first embodiment of this invention.

With reference to FIG. 1, which illustrates diagramatically the basic circuit layout of a device according to this invention, indicated at A2 is the final amplifier, in particular of a low-tension (low voltage) operated kind, e.g. which can operate off a car battery at 14.4 Volts. An output U2 of the amplifier A2 is connected, via a capacitor C1, to a loudspeaker RL. An audio signal is supplied to a signal input E2 of the amplifier A2 over a line 1 connected to an input terminal IN. The amplifier A2 has an operating voltage terminal which receives operating voltages through a line 2. A ground connection is also provided at 3. The line 2 is connected to a circuit node B which is connected, in turn, to a DC voltage source VS for operating the set. A unidirectional element D, specifically a diode is interposed between the node B and the DC voltage source Vs.

The circuit includes a second amplifier A1 having a second input E1 connected to the audio signal input terminal IN. An output U1 of the amplifier A1 is connected to the nodal point B through a connecting line 4 and an intervening capacitor C. An operating voltage terminal of the second amplifier A1 is connected via a line 5 to the operating DC voltage source VS for the set. A ground connection is also provided at 3.

Figure 2:
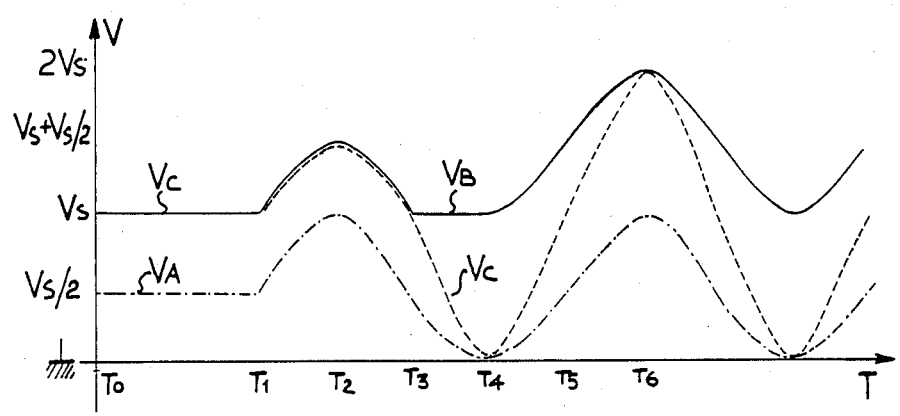
FIG. 2 is a group of voltage waveforms which show diagramatically the behavior of voltages versus time at certain points of the circuit of FIG. 1, and in particular the behavior of the maximum dynamic range being applied to a loudspeaker.

FIG. 2 shows the behaviors of the voltages present at certain significant points of the circuit of FIG. 1 versus time and at subsequent times after an audio signal is supplied to the terminal IN.

In particular, the graph shows the behavior of the maximum dynamic range being applied to the loudspeaker RL.

The voltage behaviors depicted in FIG. 2 reflect the instance where the amplifier A2 gain is twice the gain of the amplifier A1, and the DC biasings of the amplifier outputs are VS/2 for the amplifier A1, and VS for the amplifier A2.

In assessing the voltages indicated in FIG. 2, as well as of those shown in the graphs to be discussed hereinafter, neither the amplifier saturations nor the voltage drop across the diode D have been taken into account. As may be seen, in the time interval To to T1, lacking an input audio signal, a steady state is established whereby VA is equal to VS/2, VC equals VS, and VB is biased to the value of VS by the diode D. The capacitor C would be charged at a DC voltage level equal to VS/2.

From the time T1 onward, the appearance of an audio input signal simultaneously at the amplifiers A1 and A2 results in the maximum dynamic range being applied to the load RL.

At the time T2, it is observed that the voltage at the point A reaches a positive level equal to VS, whilst the voltage VB at the node B is the sum of the voltage VA plus the voltage present across the capacitor C. Overall, that voltage therefore, is shown, to be VS+VS/2. Since the node B is connected, over the line 2, to the amplifier A2 power supply, this voltage represents the supply voltage to the amplifier A2 at the time considered. Owing to the different gains of the two amplifiers, the voltage VC should reach a positive peak, with respect to its DC biasing, equal to VS. However, this is not feasible because the power supply for the amplifier A2 is, as set forth above, VS+VS/2. The positive peak of the voltage VC at the time T2, and at the first half-wave of the signal, would not exceed VS/2.

From the time T3 to the time T5, in conjunction with the graph of FIG. 2, the input half-wave is negative. In particular at the time T4, the voltage VA reaches its maximum negative peak. At this time T4, the capacitor C is charged from the diode D and achieves a voltage across it which is the equal of VS.

Again at that same time T4, the output voltage VC from the amplifier A2 reaches the potential of the negative peak by virtue of the gain of the amplifier A2 being twice that of A1. The negative peak of the output voltage from the amplifier A2 will be, accordingly, equal to VS.

All this means that, at the first half-wave of the input audio signal, the system will respond with a maximum dynamic range on the load RL equal to the sum of the two peaks of VC, namely VS/2+VS.

After the time T4, and for a constant input signal to the amplifiers, the voltage drop across the capacitor C retains a value equal to VS.

It follows that the voltage supply to the amplifier A2, as derived from the nodal point B, will be DC voltage VS overlapped by a sinusoidal signal with a maximum amplitude of VS and the same phase as the output signal from the amplifier A2.

As a consequence thereof, for a continuous input signal, after the first half-wave, a maximum dynamic range VCpp max=2VS is achieved on the load RL.

Figure 3:
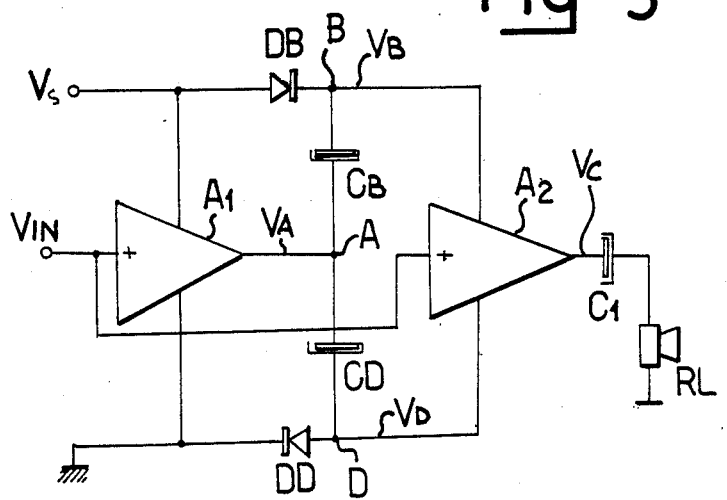
FIG. 3 shows a modification of the circuit of FIG. 1.

With reference to FIG. 3, it is observed that the diagram shown therein provides for the output from the amplifier A1 to drive a double diode-capacitance structure DB,CB and DD,CD, the one for the positive power supply and the other for the negative power supply to the amplifier A2.

The DC biasing of the outputs from the amplifiers A1 and A2 is VS/2.

The circuit shown in FIG. 3 operates in quite a similar manner to the circuit of FIG. 1.

Figure 4:
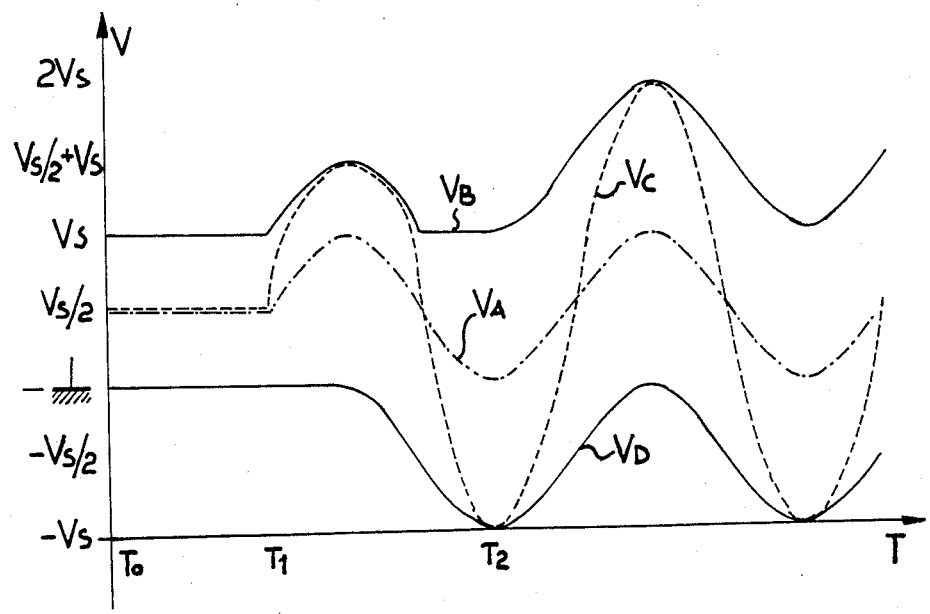
FIG. 4 is a group of voltage waveforms which show the behavior of the same voltages as in FIG. 2 but in relation to the modification of FIG. 3.

The voltage patterns at the fundamental points of the circuit, and the behavior of the maximum dynamic range applied to the load (loudspeaker) RL, are illustrated in FIG. 4 in a similar way to FIG. 2.

Assuming the gain of the amplifier A2 to be thrice that of the amplifier A1, it may be seen that the system will respond to the first input sine curve of the signal with a maximum dynamic range $VC_{pp}max=VS+VS+VS/2=2VS+VS/2$.

In a situation of continuous signal inputting, the system will respond with a dynamic range $VC_{pp}max=VS+VS/2+VS++VS/2=3VS$.

Figure 5:
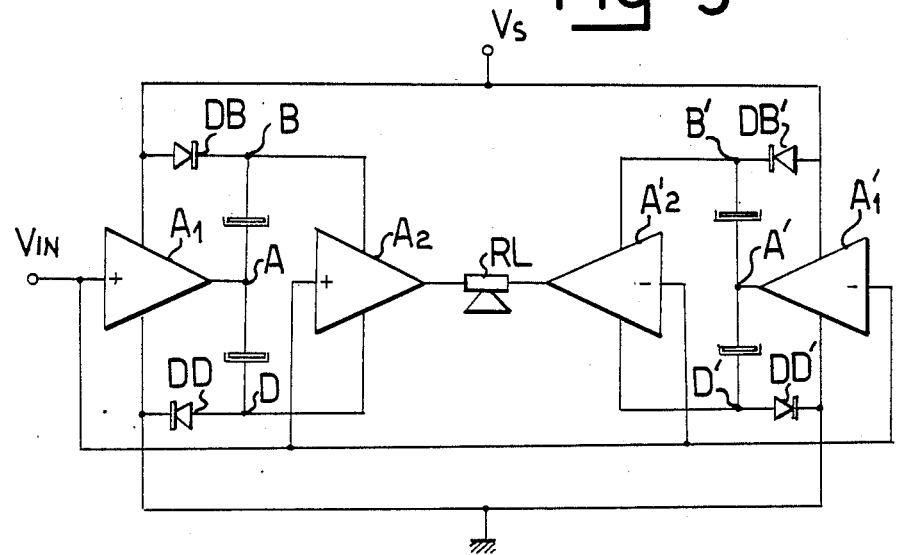
FIGS. 5 and 6 show respective bridge arrangements employing the circuits of FIGS. 1 and 3.

Making now reference to FIG. 5, it may be seen that the circuit shown is a bridge connection across the loudspeaker RL of two circuits embodying the form shown in FIG. 3.

In accordance with the circuit arrangement of FIG. 5, and in the light of the foregoing discussion of the circuits shown in FIGS. 1 and 3, it becomes possible to achieve a maximum dynamic range on the load RL in a steady state situation, as follows:

$$VC_{pp}max=6VS.$$

Figure 6:
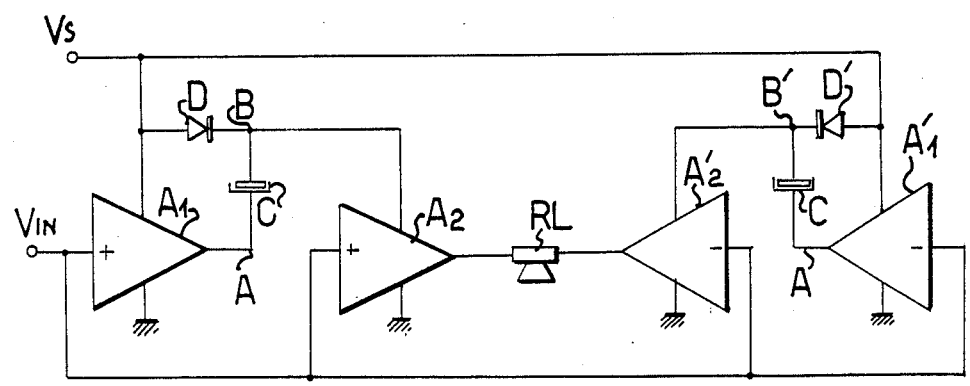

With reference to FIG. 6, there is shown a bridge connection across the loudspeaker RL of two circuits according to the circuit of FIG. 1. With that circuit arrangement, one can achieve maximum dynamic ranges on the load RL, in a steady state situation, as follows:

$$VC_{pp}max=4VS.$$

Figure 7:
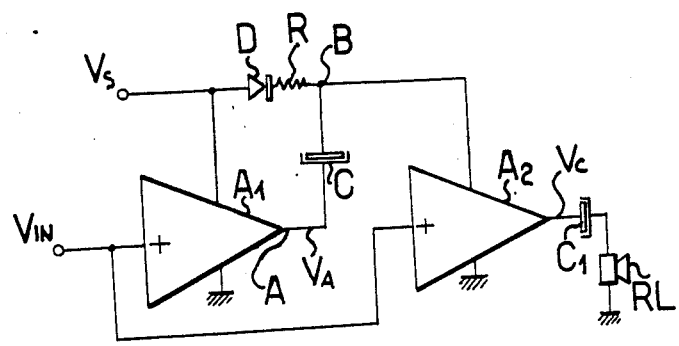
FIG. 7 shows a circuit diagram of a second embodiment of the invention.

Making reference now to FIG. 7, it is observed that the circuit described in conjunction with FIG. 1 has been modified by including a resistor R between the nodal point B and the diode D.

Given all the other conditions already discussed in conjunction with the circuit of FIG. 1, and assuming the value of the resistor R to be RL/2, the DC biasings of the amplifier outputs will be equal to VS/2 for the amplifier A1 and $\frac{3}{4}$VS for the amplifier A2.

Figure 8:
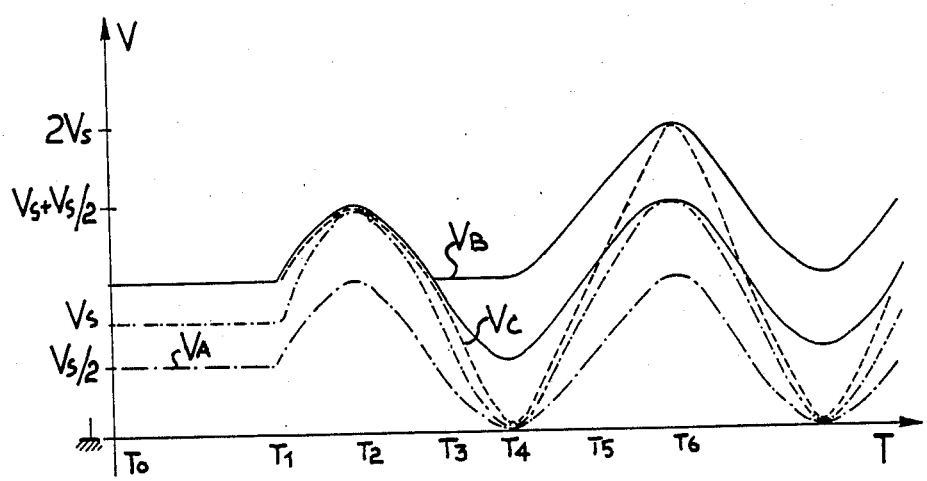
FIG. 8 is a group of waveforms which show diagramatically the behavior of the same voltages as in FIG. 2 but in relation to the embodiment of FIG. 7.

Plotted in FIG. 8 against time are the voltages appearing at various points of the circuit of FIG. 7 and the behavior of the maximum dynamic range applied to the load or loudspeaker RL.

From the graph of FIG. 8 it is taken that the voltage supply to the amplifier A2, i.e. VB, is the DC voltage VS on which is superimposed a sinusoidal signal having a maximum amplitude of VS/2 and having the same phase as the output signal from the amplifier A2. The conclusion can thus be drawn that in the presence of an input audio signal, a maximum dynamic range $VC_{pp}=3/2VS$ is to be obtained on the load RL.

In accordance with the circuit of FIG. 7, the advantage is afforded that distortion of the signal on the first input half-wave is prevented albeit at the expense of a lower maximum dynamic range of the output signal applied to the load RL over the values of the maximum dynamic ranges to be obtained with the circuits of FIGS. 1 and 3 described hereinabove.

Figure 9:
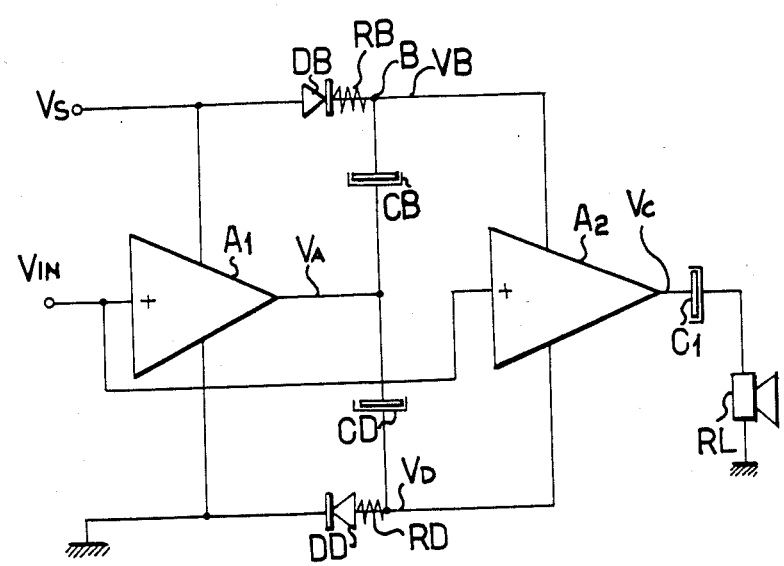
FIG. 9 shows a modification of the circuit of FIG. 7.

With reference to FIG. 9, it is observed that the circuit shown therein corresponds essentially to the circuit of FIG. 3, wherein the resistors RB and RD have been interposed respectively the positive and negative power supply sides.

Figure 10:
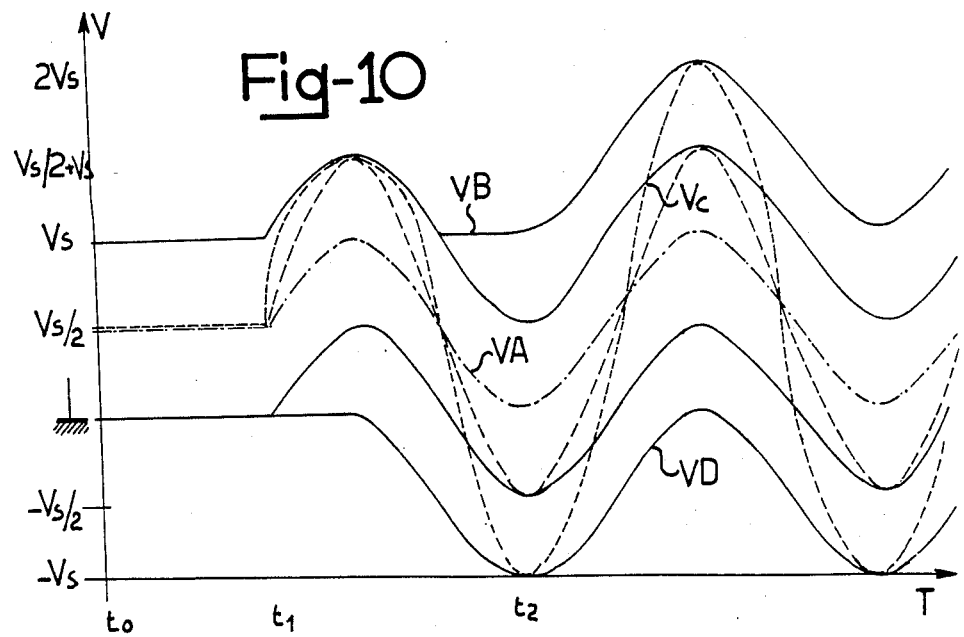
FIG. 10 is a group of waveforms which show the behavior of voltages versus time as in FIG. 2 but in relation to the modification of FIG. 9.

The voltage and maximum obtainable dynamic range patterns, for the circuit of FIG. 9, are plotted in FIG. 10 in the same way as the other diagrams of the preceding drawing figures. From FIG. 10, it is seen that the system will respond with a maximum dynamic range on the load RL as follows:

$$VC_{pp}\text{max}=VS+VS/2+VS/2=2VS.$$

Figure 11:
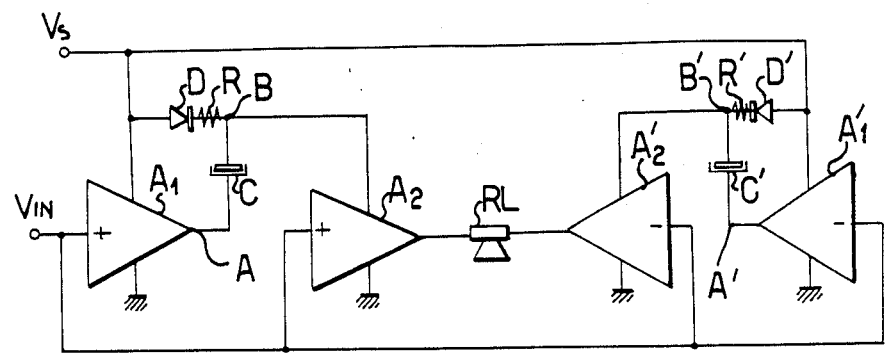
FIGS. 11 and 12 show respective bridge arrangements employing the circuits of FIGS. 7 and 9.
Figure 12:
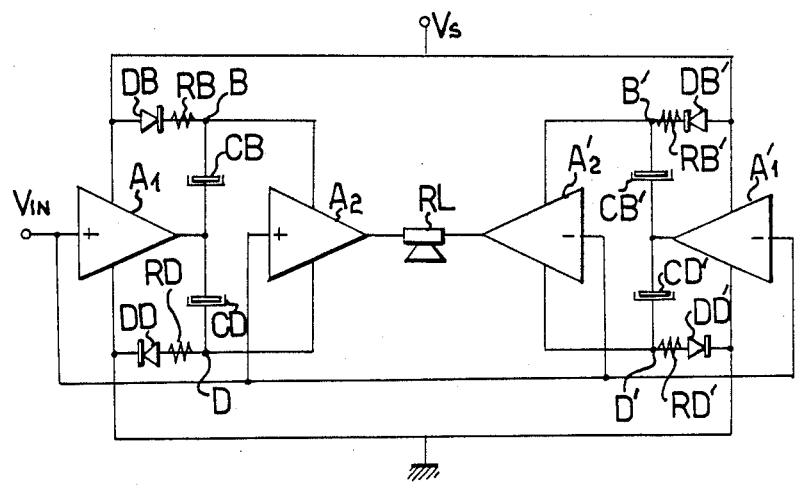

With reference to FIGS. 11 and 12, there may be seen two bridge connections across the load RL by means of of circuits according to FIG. 7 and FIG. 9.

The maximum dynamic ranges to be obtained on the load RL with the circuit arrangement of FIG. 11 may be as high as 3VS. With the circuit arrangement of FIG. 12, it becomes possible instead to achieve a steady state maximum dynamic ranges of 4VS.

Figure 13:
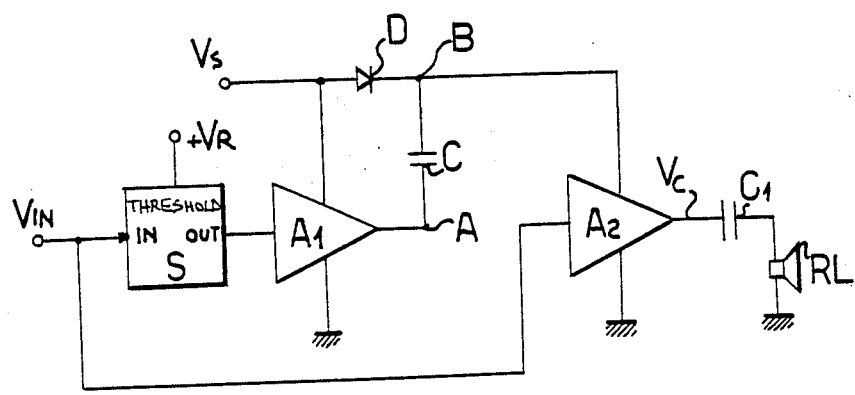
FIG. 13 shows a circuit diagram of a third embodiment of this invention.

With reference to FIG. 13, which illustrates a modified form of the invention, the reference character S designates an analog threshold circuit which transmits only those input signals which exceed the level of a preset reference voltage +VR. Those signals are sent to the input of the amplifier A1, which is connected to the amplifier A2 in the same way and by the same circuit components as in the circuit of FIG. 1.

To the input of the amplifier A2 there is fully applied instead the audio signal input to the threshold circuit S. Thus, the amplifier A2 is biased such that, lacking input signals, its output VC is at the voltage VS, which also corresponds to the voltage VB at the connection point B.

Figure 14:
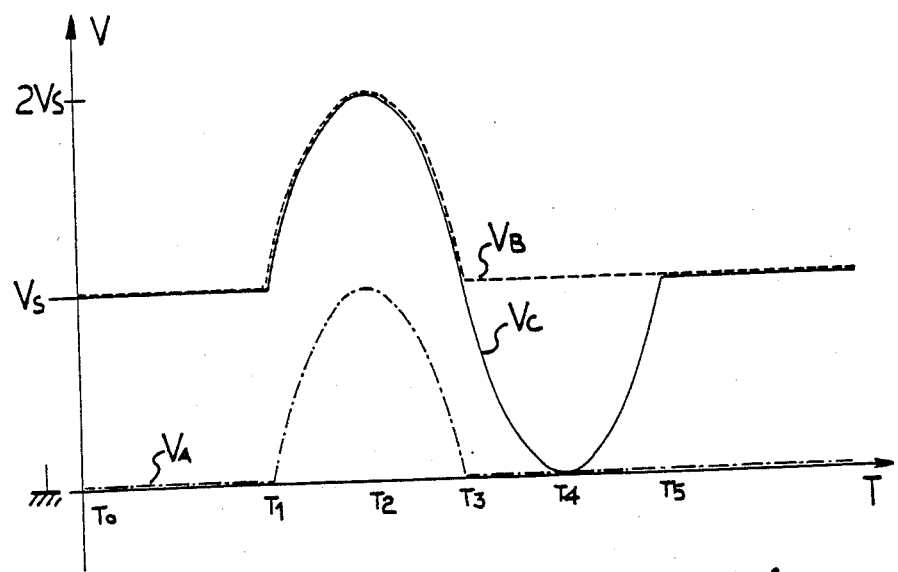
FIG. 14 shows the same voltage behaviors as in FIG. 2 but in relation to the layout of FIG. 13.

Plotted in FIG. 14 are the waveforms of the voltages at various points in the circuit of FIG. 13. These waveforms show and the maximum dynamic range to be obtained on the load RL, using corresponding symbols and procedures to those employed in the diagrams and graphs of the preceding drawing figures.

It should be noted that the voltage behaviors have been only shown at a single sine curve period of the input audio signal.

It may be seen that in a steady state situation, the voltage VC would be equal to VS.

Figure 15:
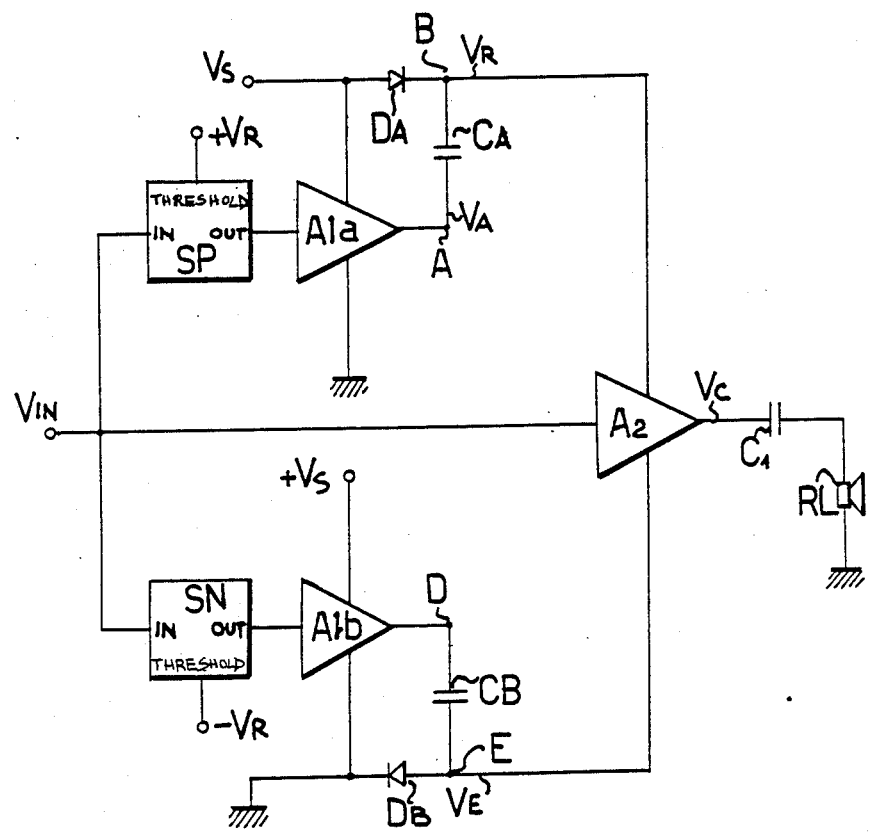
FIG. 15 shows a modification of the layout of FIG. 13.

With reference to FIG. 15, a circuit arrangement is shown therein which is based upon the embodiment of FIG. 13 and which can elevate the maximum ideal oscillation of the amplifier A2 output voltage to thrice the supply voltage VS.

The device consists of a first analog threshold circuit SP which transmits input signals having a higher amplitude than the reference voltage +VR. The output from this first threshold circuit is connected to the amplifier A1a whose output is directed to drive the positive power supply to the amplifier A2.

The device further comprises a second analog threshold circuit SN which transmits input signals having a lower amplitude than −VR. The threshold circuit SN output is connected to an amplifier A1b whose output drives the negative power supply to the amplifier A2, as may be taken from the diagram of FIG. 15. The amplifier A2 output is connected to the load RL through an intervening capacitance C1 like in the layouts of the preceding figures.

Figure 16:
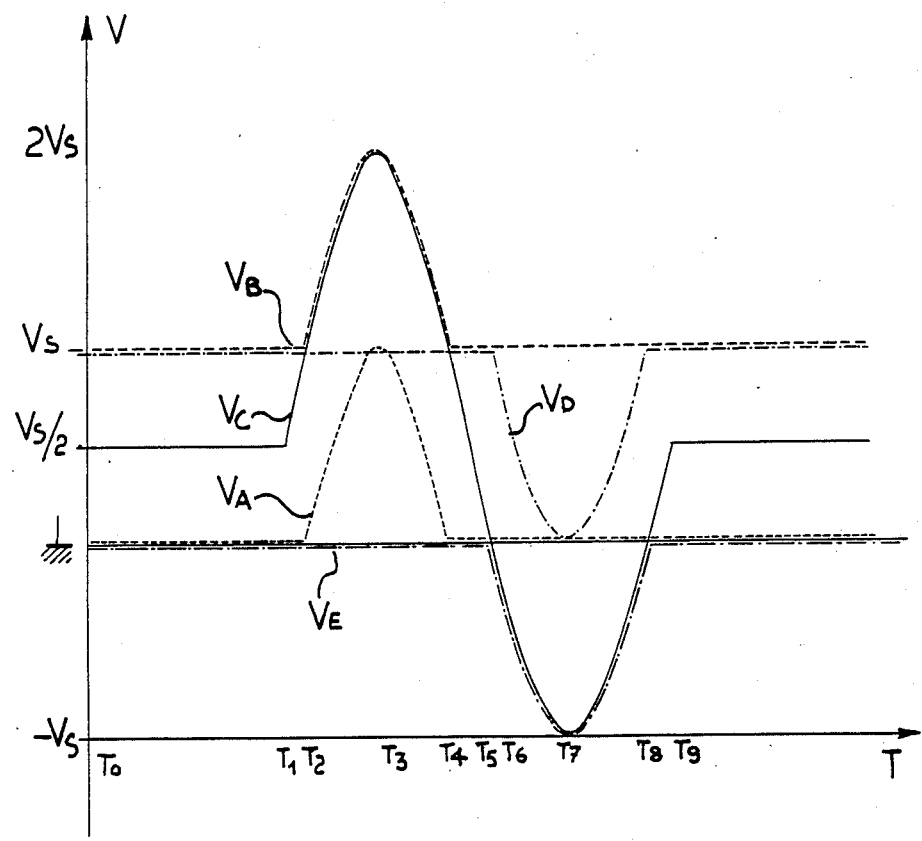
FIG. 16 shows the same voltage behaviors as in FIG. 2 but in relation to the layout of FIG. 15.

In the hypothetical instance of FIG. 16, denoting G as the amplifier gains, the threshold voltages of the circuits SP and SN will be $+VS/2G$ and $-VS/2G$, respectively.

The mode of operation of the device according to the circuit diagram of FIG. 15 is self-evident and similar to that of the circuits shown in the preceding drawing figures. The waveform of the voltages at the nodal points in the circuit of FIG. 15 appears in the graph of FIG. 16. It may be seen from that graph that, during the time interval To to T1, the situation is as follows:

$$VA=0; VB=VS; VC=VS/2; VD=VS; \text{ and}$$
$$VE=0.$$

During the time interval T1 to T2, there is present an input signal of lower amplitude than VS/2G. During this time period, the voltages VA and VD will remain at their rest levels.

During the time interval T2 to T4, the analog threshold circuit SP will begin to transmit the input signals, to supply the amplifier A1a input with a signal, $$VIN=VS/2G.$$

At the output of the amplifier A1a, there will appear, therefore, a voltage $VA=VIN.G-VS/2$.

Assuming the voltage VIN.G to achieve the value VS+VS/2, the voltage VA will reach the value VS, and since the capacitor CA is charged at the voltage VS, the voltage at the node B, i.e. VB, will be as high as 2VS.

Likewise, during the negative half-wave of the signal, through the circuit driven by SN, there will appear at the nodal point E a voltage VE equal to −VS in value.

Consequently, the overall dynamic range of the output voltage from the amplifier A2 will have the value $+2VS-(-VS)=3VS$.

The highest voltage across the power supply to the amplifier A2 never exceeds the value of 2VS.

Figure 17:
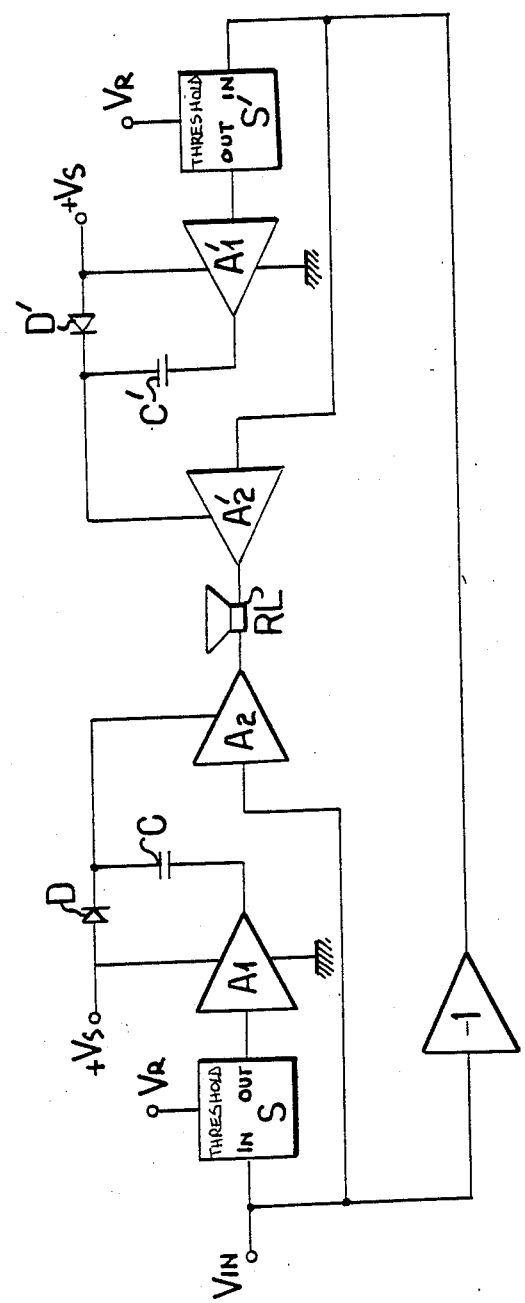
FIGS. 17 and 18 show connections of the bridge type to the loudspeaker employing the mayouts of FIGS. 13 and 15.
Figure 18:
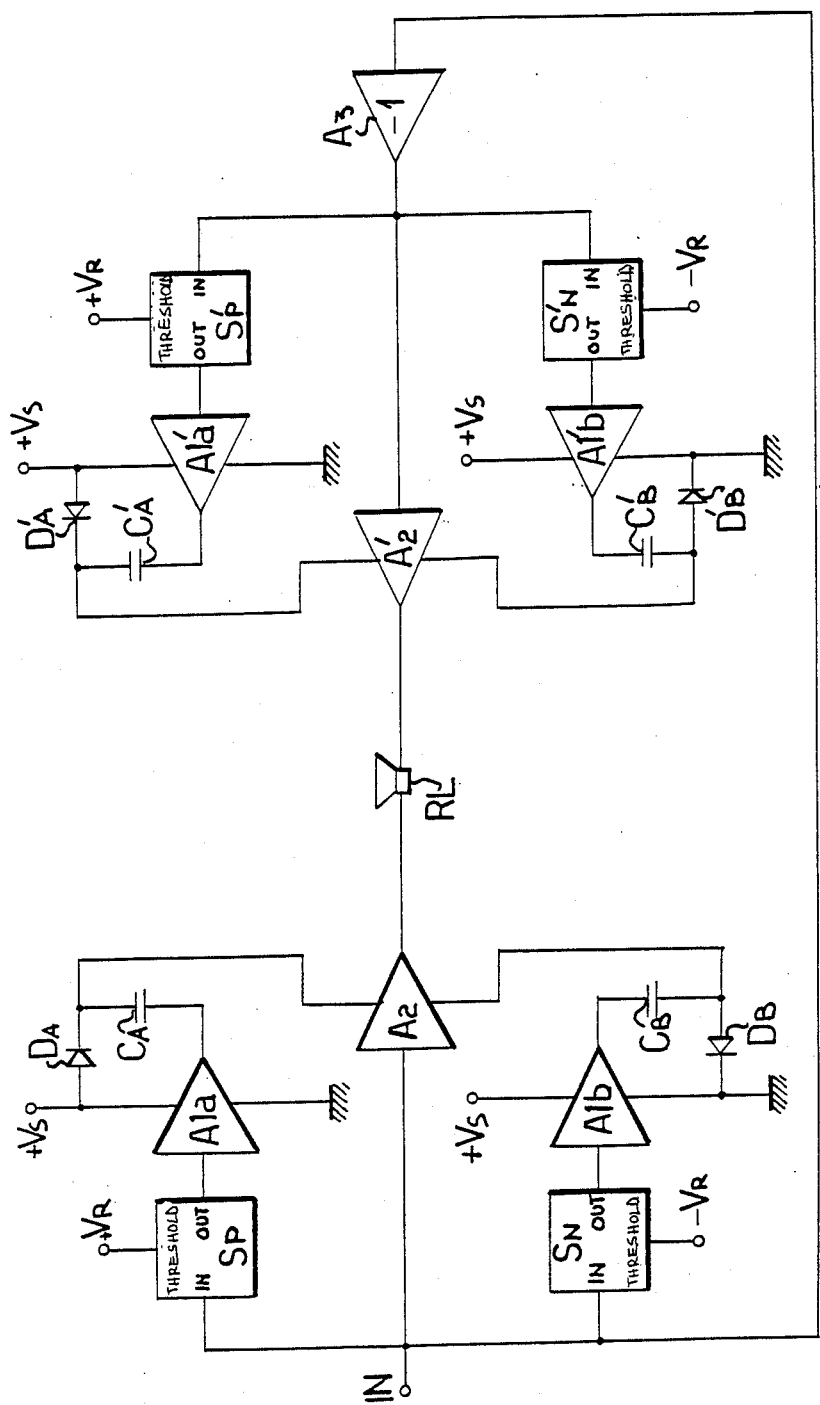

With reference to FIGS. 17 and 18, there may be seen connections of the bridge type on the load RL. Such connections afford, respectively, an ideal oscillation of the output voltage from the amplifier A2 equal to 4VS (FIG. 17) and to 6VS (FIG. 18).

Figure 19:
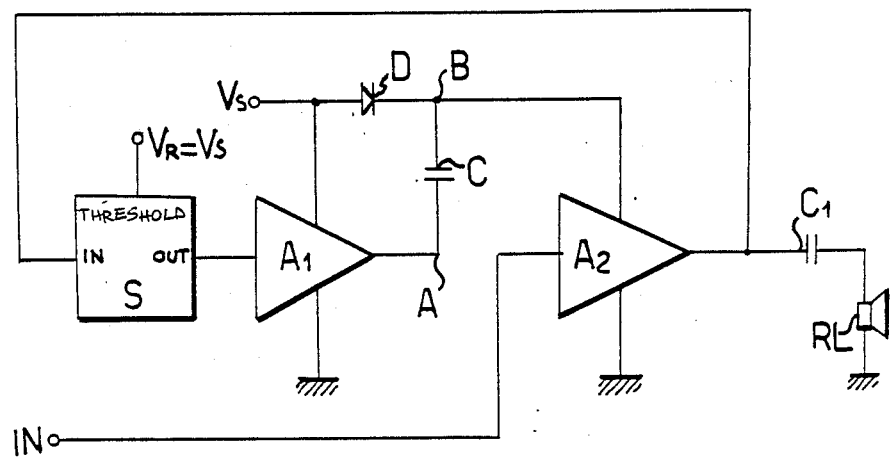
FIG. 19 shows a further modification of the layout of FIG. 13.

With reference to the diagram of FIG. 19, it is observed that the input signal for the analog threshold circuit S may consists of the output signal from the amplifier A2. In this case, the threshold voltage VR would be ideally equal to the voltage VS.

Figure 20:
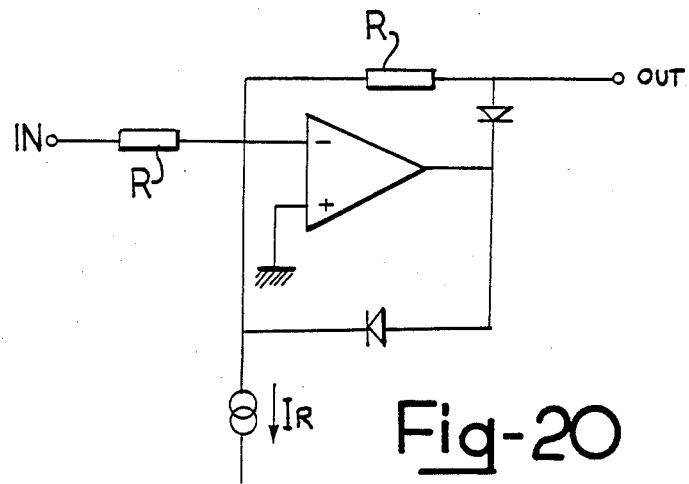
FIG. 20 shows an exemplary embodiment of an analog threshold circuit adapted for use with the layouts of FIGS. 13, 15, 17, 18 and 19.

An actual example of an analog threshold circuit is shown in FIG. 20, with elements and symbols which are quite conventional and self-evident, thereby they will be no further explained.

Thus, in accordance with this invention, it becomes possible to achieve in low-tension (low voltage) amplifying sets a higher maximum theoretical efficiency than that to be obtained with standard Class B amplifiers incorporating a DC/DC converter. Furthermore, the signal behaviors on the outputs and the power supply to the amplifiers is at all times linear, thus eliminating problems of radio band irradiation. It should be also noted that the maximum insulation voltage of the capacitors which power the final audio stage is equal to the voltage VS.

I claim:

1. An amplifier circuit suitable for audio amplification in apparatus such as automobile radios, said amplifier circuit comprising a first amplifier having an operating voltage input terminal, a signal input terminal and an operating voltage control circuit connected between said terminals, said operating voltage control circuit being constructed and connected to superimpose on an operating voltage supplied to the supply terminal, a further voltage proportional to the signal applied to said signal input terminal.

2. An amplifier circuit according to claim 1, further including a second amplifier in said operating voltage control circuit, said second amplifier having a signal input terminal connected to receive signal inputs and said second amplifier having an operating voltage input terminal connected to receive said operating voltage.

3. An amplifier circuit according to claim 1, wherein said operating voltage control circuit is arranged to apply voltages to said operating voltage terminal which are in phase with voltages applied to said input terminal.

4. An amplifier circuit according to claim 2, wherein a capacitor is connected between the output of said second amplifier and said operating voltage input terminal and wherein a unidirectional circuit element is provided between a source of operating voltage and said voltage operating input terminal.

5. An amplifier circuit according to claim 1, wherein a loudspeaker is connected to the output of said first amplifier.

6. An amplifier circuit according to claim 4, wherein said operating voltage control circuit includes a threshold circuit which permits passage of signals from said signal input terminal which exceed a predetermined threshold value lower than said operating signal voltage.

7. An amplifier circuit according to claim 6, wherein the gain of said second amplifier is at least as high as the gain of said first amplifier.

8. An amplifier circuit according to claim 6, wherein a resistor is connected between said unidirectional circuit element and a junction between said capacitor and said operating voltage input terminal of said first amplifier.

* * * * *

UNITED STATES PATENT AND TRADEMARK OFFICE
CERTIFICATE OF CORRECTION

PATENT NO. : 4,752,747  
DATED : June 21, 1988  
INVENTOR(S) : EDOARDO BOTTI, ET AL.

Page 1 of 2

It is certified that error appears in the above-identified patent and that said Letters Patent is hereby corrected as shown below:

COLUMN 1

Line 23, "ways," should read --way,--.
Line 24, "of" should be deleted.
Line 59, "and" should read --as--.

COLUMN 2

Line 17, "diagramatically" should read --diagrammatically--.
Line 29, "waveforms" should read --voltage waveforms--.
Line 30, "gramatically" should read --grammatically--.
Line 33, "waveforms" should read --voltage waveforms--.
Line 47, "mayouts" should read --layouts--.
Line 59, "gramatically" should read --grammatically--.

COLUMN 3

Line 4, "diode" should read --diode,--.
Line 6, "Vs." should read --VS.--.
Line 28, "of" should be deleted.

COLUMN 4

Line 35, "$VC_{pp}max=VS+VS/2+VS++VS/2=3VS.$" should read --$VC_{pp}max=VS+VS/2+VS+VS/2=3VS.$--.

COLUMN 5

Line 21, after "respectively" add --in--.
Line 57, "and" should be deleted.

UNITED STATES PATENT AND TRADEMARK OFFICE
CERTIFICATE OF CORRECTION

PATENT NO. : 4,752,747

DATED : June 21, 1988

INVENTOR(S) : EDOARDO BOTTI, ET AL.

It is certified that error appears in the above-identified patent and that said Letters Patent is hereby corrected as shown below:

COLUMN 6

Line 66, "consists" should read --consist--.

COLUMN 7

Line 3, "thereby" should read --therefore--.
Line 16, "I claim:" should read --We claim:--.

Signed and Sealed this

Tenth Day of January, 1989

Attest:

DONALD J. QUIGG

Attesting Officer      Commissioner of Patents and Trademarks